(12) United States Patent
Zhang

(10) Patent No.: US 7,365,610 B2
(45) Date of Patent: Apr. 29, 2008

(54) PUSH COMPENSATION IN AN OSCILLATOR

(75) Inventor: Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 31 days.

(21) Appl. No.: 11/085,404

(22) Filed: Mar. 21, 2005

(65) Prior Publication Data

US 2006/0208810 A1 Sep. 21, 2006

(51) Int. Cl.
*H03B 5/12* (2006.01)

(52) U.S. Cl. ............... 331/36 C; 331/117 R; 331/117 FE; 331/105; 331/177 V

(58) Field of Classification Search ............ 331/117 R, 331/36 C, 177 V, 117 FE, 167, 105
See application file for complete search history.

(56) References Cited

U.S. PATENT DOCUMENTS

| | | | |
|---|---|---|---|
| 5,694,092 A * | 12/1997 | Oba et al. ............... | 331/117 R |
| 6,118,154 A * | 9/2000 | Yamaguchi et al. ........ | 257/360 |
| 6,545,555 B1 | 4/2003 | Justice et al. | |
| 6,803,829 B2 * | 10/2004 | Duncan et al. ............... | 331/34 |
| 6,853,262 B2 * | 2/2005 | Feilkas et al. ............ | 331/117 R |
| 7,113,050 B1 * | 9/2006 | Lindgren ............... | 331/117 FE |
| 7,116,183 B2 | 10/2006 | Wu | |
| 2005/0285687 A1 | 12/2005 | Zhang et al. | |

\* cited by examiner

*Primary Examiner*—Robert J. Pascal
*Assistant Examiner*—Levi Gannon
(74) *Attorney, Agent, or Firm*—Zagorin O'Brien Graham LLP

(57) ABSTRACT

The effect of supply voltage variations on an oscillator circuit output are compensated for to reduce supply pushing. The change in a value of a first capacitance in a first direction in response to the variation in the supply voltage is canceled using one or more diodes having a capacitance that changes in a second direction, opposite the first direction, in response to the variation in the supply voltage.

12 Claims, 6 Drawing Sheets

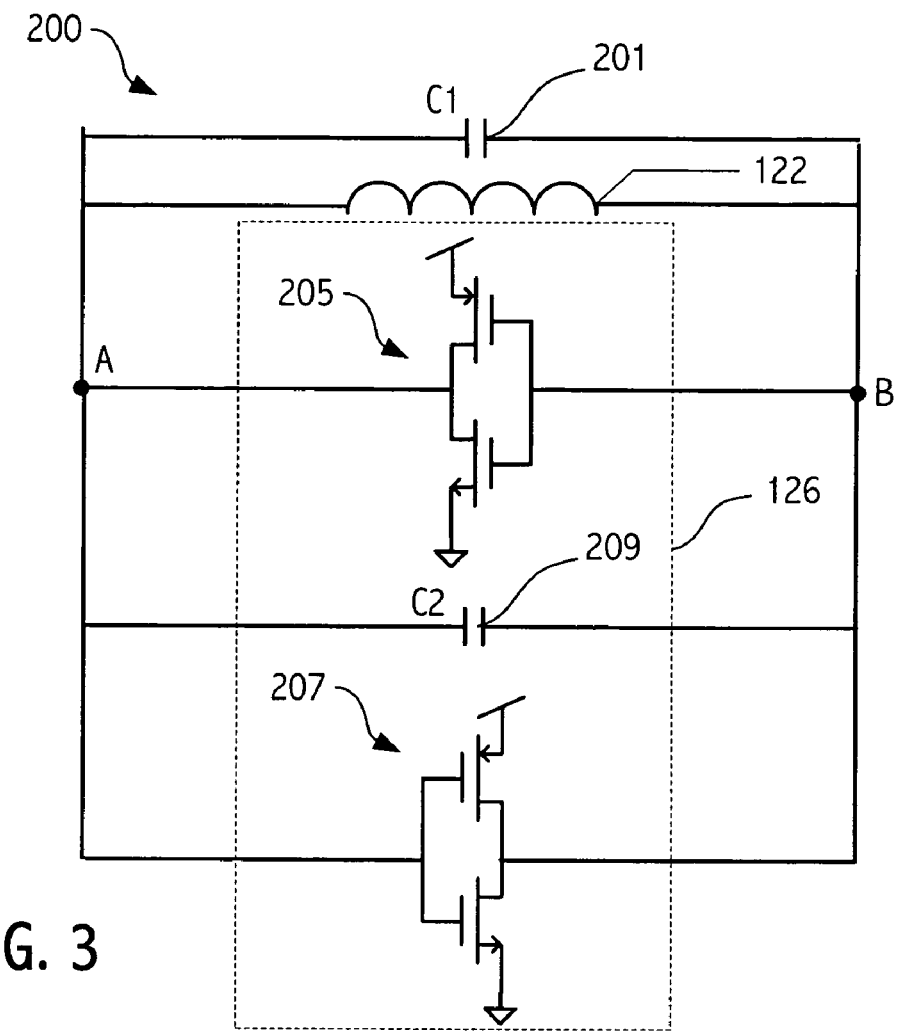
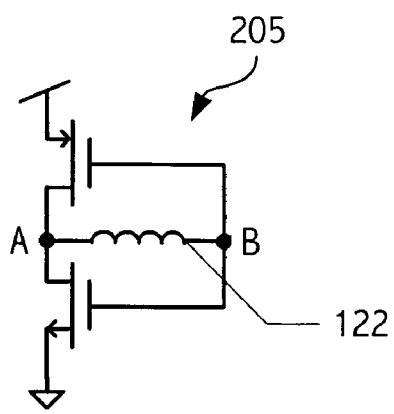
FIG. 4
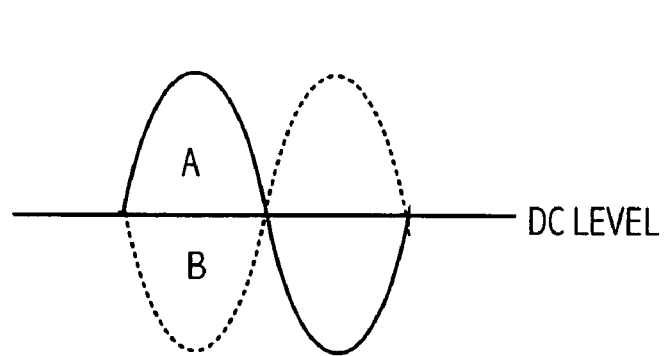
FIG. 5
FIG. 3

PUSH COMPENSATION IN AN OSCILLATOR

BACKGROUND

1. Field of the Invention

This application relates to oscillator circuits and more particularly to compensating for the effect of variations in the supply voltage on oscillator output.

2. Description of the Related Art

Voltage controlled oscillators are commonly found in such applications as phase-locked loop circuits. FIG. 1 illustrates a high level block diagram of a phase-locked loop 100. In the phase-locked loop 100 an input signal 101 and a feedback signal 103 are coupled to a phase/frequency detector 105 that determines the phase/frequency difference between the input signal 101 and the feedback signal 103. That difference is supplied to a loop filter 104, which supplies a control voltage on node 118 to vary the output of the voltage controlled oscillator (VCO) 110 in accordance with the control voltage. The voltage controlled oscillator (VCO) may be implemented using an LC tank circuit in which the oscillating frequency of the VCO is proportional to $\sqrt{1/LC}$. It is common to vary the capacitance (C) to change the output frequency of the VCO.

When the supply voltage for the VCO changes as a result of, e.g., transient noise on the supply voltage, the output of the VCO can change. Such a change in VCO output is referred to as "supply pushing". Supply pushing for a VCO is defined as an oscillation frequency change resulting from a supply voltage change (Δf/Δsupply voltage). If a VCO has large pushing, the oscillation frequency is sensitive to supply movement. In such cases supply noise directly translates into frequency change. Frequency change in turn integrates into phase change. When a VCO is sensitive to noise on the supply voltage, a noise profile on the supply voltage translates directly to the noise profile of the VCO output. VCO Single Sideband (SSB) phase noise (dBc/Hz) due to supply noise can be calculated as $$10\log\frac{Kp^2 \times V^2rms}{2f^2}(\text{dB}c/\text{Hz}),$$

, where the supply noise is assumed to have an rms amplitude of Vrms and a frequency off and Kp is the supply pushing in Hz/V.

Many specifications for communication modules allow at least some noise on the supply voltage. For example, the supply voltage for a board may be allowed to vary 10 mV peak to peak across frequencies. That means the integrated circuits on the board should be able to reject that noise at any frequency. Some specifications are even more difficult to meet. For example, the 10-Gigabit Serial Interface Module Group (XFP) specification allows peak to peak supply voltage variation by as much as 3%.

One possible approach to deal with power supply variations is to filter the power supply output. However, an RC filter would tend to drop the power supply voltage, which is undesirable particularly at the low voltage power supplies typical today. An LC filter could be used instead but only filters at certain frequencies.

Another solution is to have a voltage regulator on chip. In fact multiple regulators may be utilized. For example, a first regulator may be used to provide 20 dB of rejection and a second cascaded regulator can be used to increase the rejection to 40 dB. In the case of a 10 mV peak to peak power supply variation a 10 mV swing reaches the VCO 40 dB down. VCO regulators have to be stable and have low noise generation because of pushing. So the VCO regulator has to adequately reject supply noise (therefore two stages may be utilized) and its own noise has to be very small. Otherwise, whatever noise is on the regulator output is provided as part of the VCO supply voltage and will translate into phase noise if the VCO is susceptible to pushing. That can be particularly true in certain LC oscillator designs.

SUMMARY

It would be desirable to attenuate supply noise across the frequency band without a voltage drop. A design with zero or low Kp provides such attenuation and allows use of a regulator having less stringent requirements in terms of reducing power supply noise.

Accordingly, according to an embodiment of the invention, a method is provided for compensating for the effects of supply voltage noise on oscillator output. The method includes reducing variation in output of an oscillator circuit caused by variation in a supply voltage for the oscillator circuit, by offsetting a change in a value of a first capacitance in a first direction in response to the variation in the supply voltage with a diode structure having a capacitance that changes in a second direction, opposite the first direction, in response to the variation in the supply voltage.

In another embodiment the invention provides an oscillator circuit that includes a first capacitance that increases with an increase in a supply voltage coupled to the oscillator circuit. A diode structure, having a second capacitance that decreases with the increase in the supply voltage, offsets the increase in the first capacitance and thereby substantially reduces sensitivity of the oscillator circuit to supply variations.

BRIEF DESCRIPTION OF THE DRAWINGS

The present invention may be better understood, and its numerous objects, features, and advantages made apparent to those skilled in the art by referencing the accompanying drawings.

FIG. 3 illustrates a more detailed diagram of a VCO.

FIG. 4 illustrates inverter 205 with the inductor between the inputs and output of the inverter.

FIG. 5 illustrates the voltage at nodes A and B of the VCO.

The use of the same reference symbols in different drawings indicates similar or identical items.

DESCRIPTION OF THE PREFERRED EMBODIMENT(S)

Figure 1:
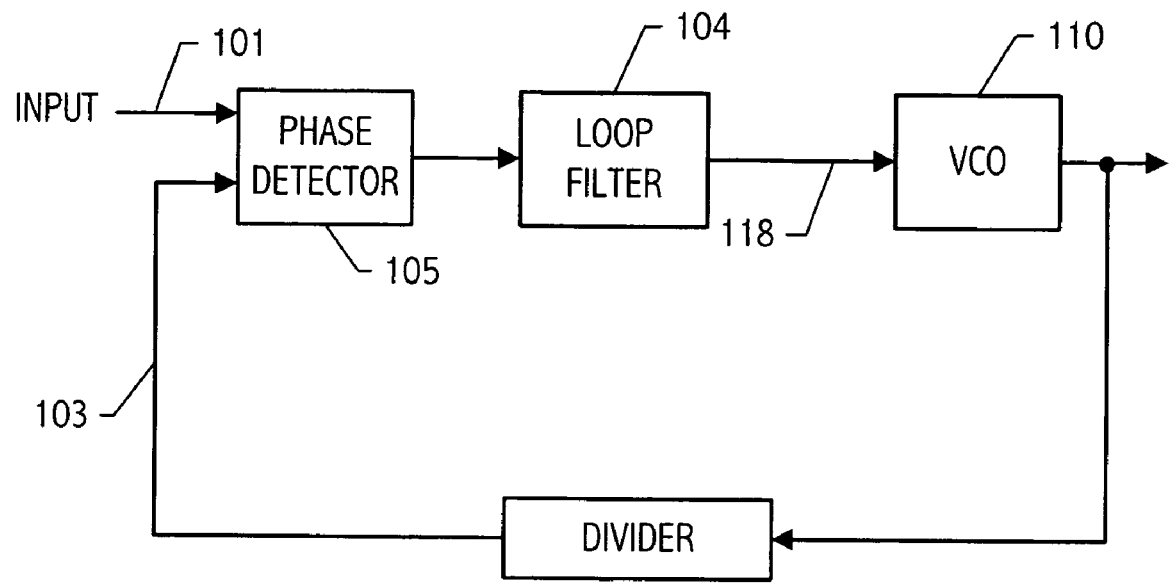
FIG. 1 illustrates a basic diagram of a phase-locked loop circuit.
Figure 2:
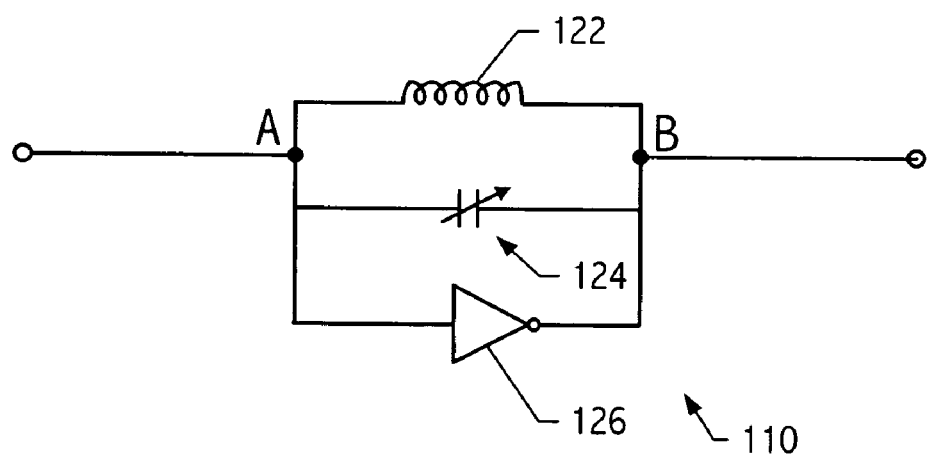
FIG. 2 illustrates a high level diagram of an exemplary voltage controlled oscillator (VCO).

Referring to FIG. 2, an exemplary VCO circuit is shown. The exemplary VCO circuit is an LC tank circuit and includes an inductor 122, a variable capacitance circuit 124, and a gain or amplifier circuit 126. The output of the VCO can be varied by varying the capacitance circuit 124 in accordance with the control voltage supplied on node 118 (FIG. 1). The oscillating frequency of the VCO is proportional to $\sqrt{1/LC}$.

Referring to FIG. 3, the VCO is shown in more detail. The amplifier circuit 126 includes the inverters 205 and 207. Capacitance is also associated with the amplifier circuit and is represented as capacitance 209 (C2), which is the effective capacitance of the amplifier 126. The capacitance 201 (C1) represents the capacitance of the VCO that is varied to control the VCO output and is relatively constant with respect to supply voltage. The total capacitance of the tank circuit C=C1+C2, where C1 represents the capacitance associated with the varactor primary control and C2 is capacitance associated with an undesired secondary control mechanism. The goal is to introduce a third control mechanism that offsets the undesired secondary control mechanism as explained more fully below.

As explained more fully below, the active devices in the amplifier have capacitance that changes when the bias changes. That causes the capacitance of the tank circuit to change and thus the VCO output frequency to change. Referring to FIG. 4, the inverter 205 is shown with the input and output of the inverter 205 coupled by the inductor 122. Referring to FIG. 5, the waveforms present on nodes A and B are illustrated. The voltage present on node A is 180 degrees out of phase with the voltage present on node B.

The voltages at A and B are biased at some DC level. The DC level depends on the ratio of the P and N channel devices. The DC level is some fraction of the voltage supply ($V_{SUP}$). The DC level ($V_{DC}$) is typically set to half of $V_{SUP}$ to allow maximum voltage swing, e.g., from $V_{SUP}$ to ground. So when $V_{SUP}$ changes, the DC bias at nodes A and B also changes. Assume $V_{SUP}$ changes as follows:

$$V_{DC}(A+B) = \tfrac{1}{2}(V_{SUP}) \quad (1)$$

$$V'_{SUP} = V_{SUP} + \Delta V \quad (2)$$

$$V'_{DC}(A+B) = \tfrac{1}{2}(V_{SUP} + \Delta V) = \tfrac{1}{2}V'_{SUP} \quad (3)$$

$$\Delta V_{DC}(A+B) = \tfrac{1}{2}\Delta V \quad (4)$$

Thus, in the embodiment discussed above, as the supply voltage changes by ΔV, the gate to source voltage (Vgs) for the N-channel device in the inverters moves up by ½ΔV. Similarly for the P-channel devices, the gate to source voltage Vgs moves by ½ΔV.

Figure 6:
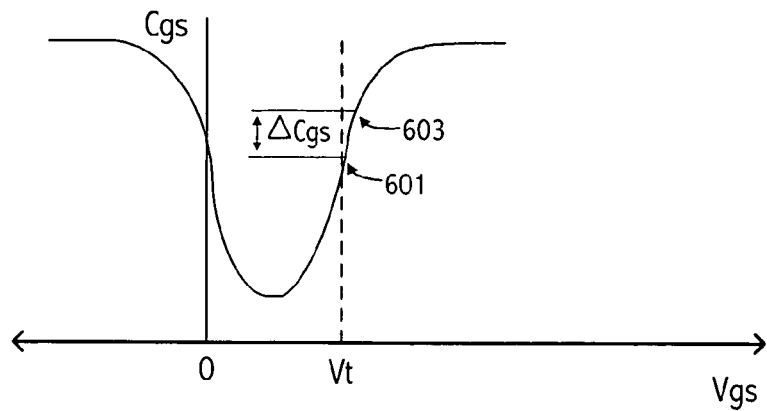
FIG. 6 illustrates a graph of gate to source capacitance versus gate to source voltage.
Figure 7:
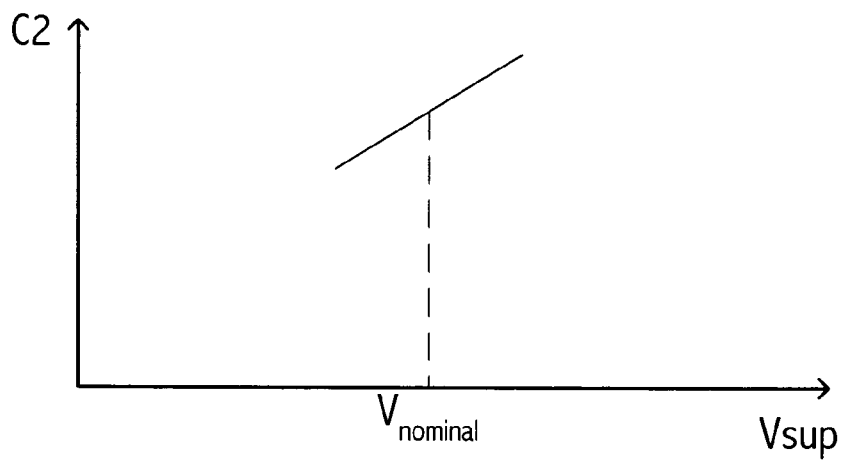
FIG. 7 illustrates a graph of the capacitance C2 versus the supply voltage $V_{SUP}$.

The change in the gate voltage changes the capacitance of the active devices. Changing the capacitance of the active devices in turn changes the oscillation frequency of the VCO. Referring to FIG. 6, illustrated is a graph showing gate capacitance Cgs versus gate voltage Vgs for an N-channel device. After the voltage Vgs is significantly beyond the threshold voltage Vt, the change in capacitance ΔCgs in response to the change to supply voltage decreases. However, there is a significant region in the curve shown in FIG. 6, where the capacitance ΔCgs changes significantly in response to changes in Vgs, from e.g., 601 to 603. The change in capacitance is similar for P-channel devices, that is, as the supply voltage increases, the capacitance increases. Thus, the capacitance in the amplifier formed by the gate capacitance of the active devices varies directly with the supply voltage. As the supply voltage goes up, the capacitance goes up and similarly, as the supply voltage goes down, the capacitance goes down. That in turn changes the frequency of the VCO. As the capacitance goes up, the VCO output frequency goes down and vice versa. Referring to FIG. 7, the capacitance C2, which is formed substantially by the gate capacitances for the P and N channel devices in the amplifier, increases as the supply voltage $V_{SUP}$ increases. As the capacitance C2 increases, the frequency of the oscillator decreases.

Figure 8:
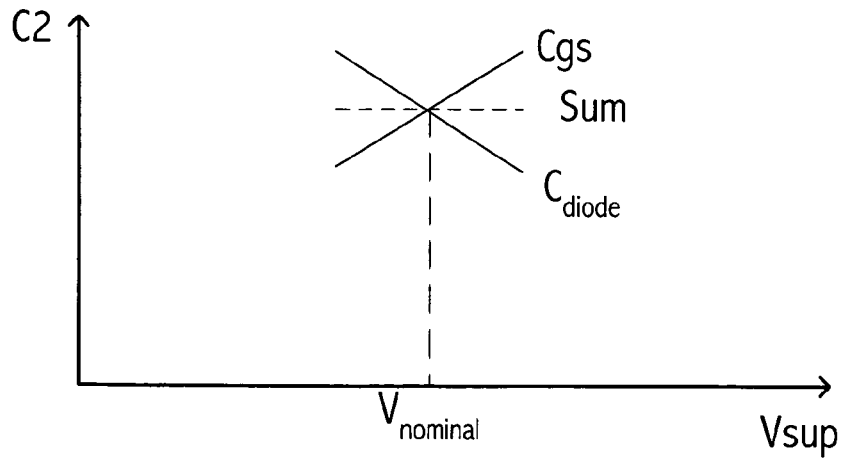
FIG. 8 illustrates graphically how diode capacitance can be utilized to cancel the change in capacitance C2.

In order to reduce the susceptibility of the VCO to pushing, the change in capacitance caused by supply voltage variations due to noise should be reduced. One approach to compensating for the direct relationship between change in supply voltage and capacitance is to provide an offsetting capacitance that is inversely related to the supply voltage. Thus, as supply voltage increases, the capacitance decreases. A diode has the characteristic that its capacitance is reduced as the voltage across the diode increases. Thus, as shown in FIG. 8, a diode can be utilized to provide a compensating capacitance $C_{diode}$ that decreases with increasing supply voltage. If the diode is sized appropriately, the increase in gate to source capacitance of the transistors in the amplifier can be offset by the diode capacitance, such that the sum of the two capacitances is substantially constant. Thus, the change in Cgs can be canceled by $C_{diode}$.

Although the capacitance changes in response to supply voltage changes in the amplifier and diode are nonlinear overall, around a particular voltage of interest, for example, the nominal supply voltage, the change is substantially linear around a narrow region around that nominal supply voltage and the diode can be sized to substantially cancel changes in Cgs as shown in FIG. 8. That narrow region around the nominal supply voltage where the change in capacitance appears linear, corresponds to, e.g., a 10 mV peak to peak supply voltage variation. The narrow region may of course correspond to other supply voltage variations and the change in capacitance may not provide perfect cancellation. In fact, the cancellation may vary considerably based on the process corner. Thus, one may design for a typical process where the changes in capacitances appear substantially linear in a narrow region around the nominal supply voltage and cancellation may be close to ideal. However, the cancellation may be imperfect at, e.g., the fast and slow process corners, because the slope and shape of the Cgs and the $C_{diode}$ curves shown in FIG. 8 may be different at the process corners. The goal is to substantially reduce oscillator output variations that are caused by variations in supply voltage typically resulting from noise associated with the supply voltage. That is accomplished if Kp is substantially reduced. In embodiments in which the supply voltage tracks the process, the cancellation may work well even at the process corners.

Figure 9:
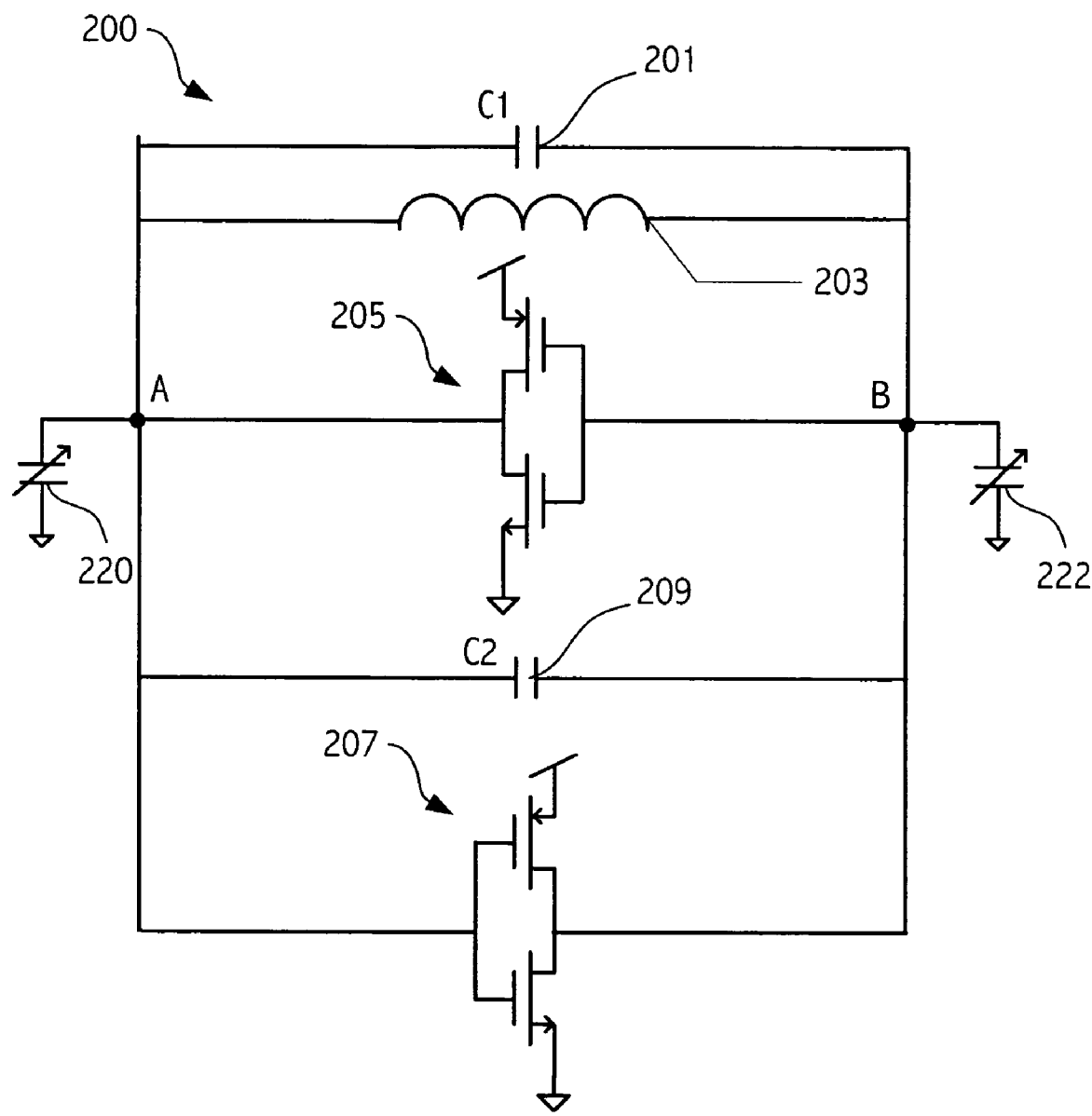
FIG. 9 illustrates an embodiment of the invention in which a variable capacitance is used to cancel the change in capacitance C2 caused by variations in the supply voltage.
Figure 10:
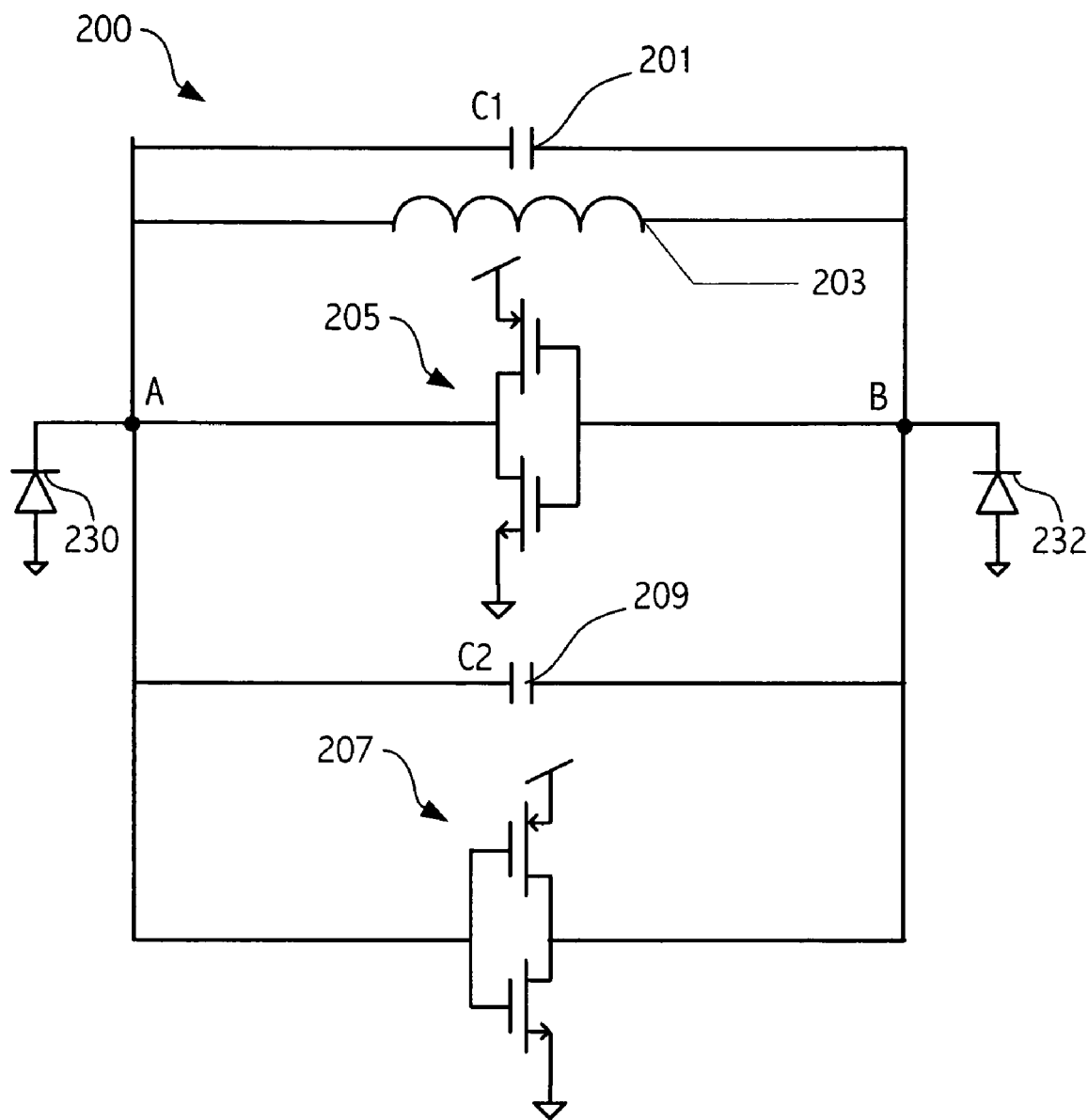
FIG. 10 illustrates an embodiment of the invention in which the variable capacitance is implemented using a diode.
Figure 11:
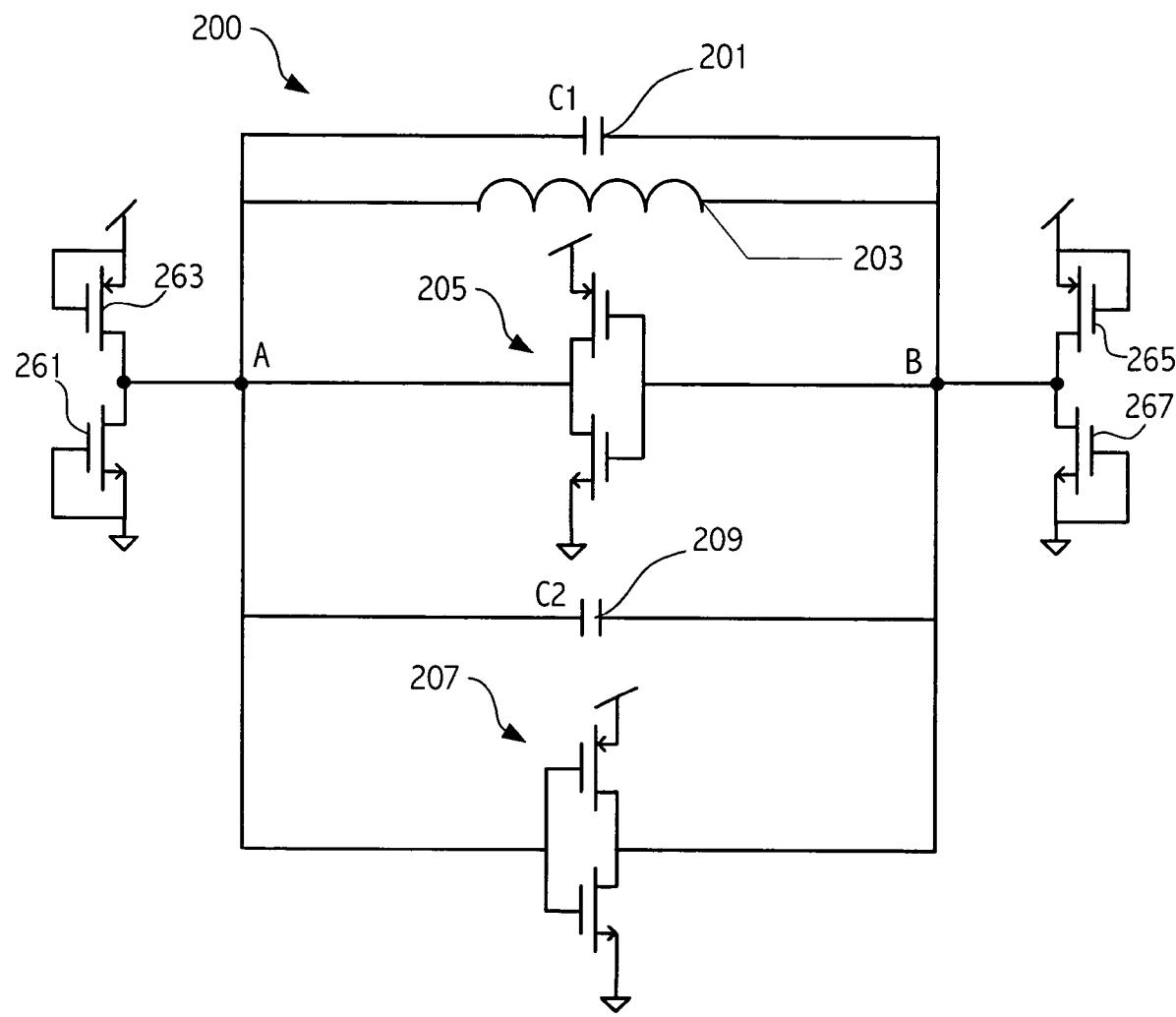
FIG. 11 illustrates various embodiments of the invention utilizing diode structures to provide compensating capacitance to cancel changes in C2 that occur because of noise on the VCO supply voltage.

Referring to FIG. 9, an exemplary embodiment of the invention includes variable capacitances 220 and 222, which offset the change in the capacitance C2 caused by changes in the supply voltage (not shown in FIG. 9) to the VCO. Referring to FIG. 10, the variable capacitance may be implemented as diodes 230 and 232, which have a capacitance that varies inversely with changes in the supply voltage. The voltage across the diodes 230 and 232 varies with $V_{SUP}$ and if $V_{SUP}$ goes up, the capacitance of the diode goes down. Referring to FIG. 11, the diodes 230 and 232 may be implemented by N-channel transistors 261 and 267. To balance process variations better, the diodes can be half P-channel and half N-channel. That embodiment is illustrated in FIG. 11 with transistors 261 and 263 and transistors 265 and 267 forming the diodes. The transistors should be sized to provide the desired cancellation as the slope of the $C_{diode}$ curve shown in FIG. 8 varies with the size of the diode.

Note that the addition of the cancellation diodes, shown as transistors 261, 263, 265, and 267 in FIG. 11, increases the overall capacitance of the tank circuit so C1 (see FIG. 3) has to be made smaller. That may reduce the tuning range of the VCO.

Thus, various embodiments have been described. The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. A method comprising:
reducing variation in output of an oscillator circuit caused by variation in a supply voltage for the oscillator circuit, by offsetting a change in a value of a first capacitance in a first direction in response to the variation in the supply voltage with a diode structure having a capacitance that changes in a second direction, opposite the first direction, in response to the variation in the supply voltage,
wherein the diode structure is sized to offset changes in capacitance around a nominal supply voltage substantially linearly in a region around the nominal supply voltage,
wherein the diode structure comprises a transistor coupled to the first capacitance and a first power supply node,
wherein the transistor is a metal oxide semiconductor (MOS) transistor, having a channel region of a first conductivity type, and
wherein the diode structure further comprises another transistor having a channel region of a second conductivity type and coupled to a second power supply node.

2. The method as recited in claim 1 wherein the diode structure is sized to offset changes in capacitance around a nominal supply voltage substantially linearly in a region around the nominal supply voltage.

3. The method as recited in claim 1 wherein the first conductivity type is N and the second conductivity type is P.

4. An oscillator circuit comprising:
a first capacitance that increases with an increase in a power supply voltage coupled to the oscillator circuit; and
a diode structure having a second capacitance that decreases with the increase in the supply voltage to substantially offset the increase in the first capacitance to thereby substantially reduce sensitivity of the oscillator circuit to supply variations,
wherein the diode structure is sized to offset changes in capacitance around a nominal supply voltage substantially linearly in a region around the nominal supply voltage,
wherein the diode structure comprises at least a first transistor coupled to the first capacitance and a first power supply node,
wherein the first transistor is a metal oxide semiconductor (MOS) transistor, having a channel region of a first conductivity type, and
wherein the diode structure further comprises a second transistor having a channel region of a second conductivity type, the second transistor being coupled to a second power supply node, the first transistor, and the first capacitance.

5. The oscillator circuit as recited in claim 4 wherein the oscillator circuit is a voltage controlled oscillator (VCO).

6. The oscillator circuit as recited in claim 5 wherein the oscillator circuit is an LC oscillator circuit.

7. The method as recited in claim 4 wherein the first conductivity type is N and the second conductivity type is P.

8. The oscillator circuit as recited in claim 4 wherein the first capacitance corresponds to, at least in part, gate to source capacitance of one or more transistors in the oscillator circuit, the gate to source capacitance varying directly with the variations in the supply voltage.

9. The oscillator circuit as recited in claim 4 wherein the diode structure is sized to substantially offset an approximately 10mV peak-to-peak supply voltage variation.

10. An integrated circuit comprising:
a first capacitance within an oscillator circuit that varies directly with a variation in a supply voltage coupled to the oscillator circuit; and
means for offsetting the variation in the first capacitance due to variations in the supply voltage to thereby make the oscillator circuit less sensitive to the supply voltage variations, wherein the means for offsetting is configured to offset changes in capacitance around a nominal supply voltage substantially linearly in a region around the nominal supply voltage, wherein the means for offsetting comprises a diode structure comprising a first transistor and a second transistor having a channel region of a first conductivity type and a channel region of a second conductivity type, respectively, the first and second transistors being coupled respectively to a first power supply node and a second power supply node, and being coupled to the first capacitance and being coupled to each other.

11. The integrated circuit as in claim 10 wherein the oscillator circuit is an LC oscillator.

12. The integrated circuit as in claim 10 wherein the diode structure is coupled to each output of the oscillator circuit and the means for offsetting has a second capacitance that varies inversely with the variation in the voltage to substantially offset the variation in the first capacitance.

* * * * *

UNITED STATES PATENT AND TRADEMARK OFFICE
CERTIFICATE OF CORRECTION

| | | |
|---|---|---|
| PATENT NO. | : 7,365,610 B2 | Page 1 of 1 |
| APPLICATION NO. | : 11/085404 | |
| DATED | : April 29, 2008 | |
| INVENTOR(S) | : Ligang Zhang | |

It is certified that error appears in the above-identified patent and that said Letters Patent is hereby corrected as shown below:

In column 5, claim 2, please replace in its entirety:

--2. The method as recited in claim 1 wherein the first capacitance corresponds to, at least in part, gate to source capacitance of one or more transistors in the oscillator circuit that increases with an increase in supply voltage.--

In column 6, line 23, claim 7, please replace "method" with --oscillator circuit--.

Signed and Sealed this

Fourteenth Day of October, 2008

JON W. DUDAS
*Director of the United States Patent and Trademark Office*